United States Patent
Yoo et al.

(10) Patent No.: US 9,048,199 B2
(45) Date of Patent: Jun. 2, 2015

(54) SEMICONDUCTOR PACKAGE AND METHOD OF MANUFACTURING THE SEMICONDUCTOR PACKAGE

(71) Applicant: SAMSUNG ELECTRO-MECHANICS CO., LTD., Gyunggi-do (KR)

(72) Inventors: Do-Jae Yoo, Gyeonggi-do (KR); Jae-Cheon Doh, Gyeonggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 88 days.

(21) Appl. No.: 13/660,655

(22) Filed: Oct. 25, 2012

(65) Prior Publication Data

US 2013/0045574 A1 Feb. 21, 2013

Related U.S. Application Data

(62) Division of application No. 12/892,411, filed on Sep. 28, 2010, now abandoned.

(30) Foreign Application Priority Data

Jun. 3, 2010 (KR) .......................... 10-2010-0052413

(51) Int. Cl.
*H01L 21/00* (2006.01)
*H01L 23/31* (2006.01)
*H01L 23/552* (2006.01)
*H01L 23/00* (2006.01)

(52) U.S. Cl.
CPC .......... *H01L 23/3121* (2013.01); *H01L 23/552* (2013.01); *H01L 24/16* (2013.01); *H01L 24/29* (2013.01); *H01L 24/73* (2013.01); *H01L 2224/16225* (2013.01); *H01L 2224/291* (2013.01); *H01L 2224/73253* (2013.01); *H01L 2924/19107* (2013.01); *H01L 2924/01033* (2013.01); *H01L 2924/19105* (2013.01); *H01L 2924/15311* (2013.01); *H01L 2924/1815* (2013.01)

(58) Field of Classification Search
USPC .......................... 438/124, 127; 257/E21.502
See application file for complete search history.

(56) References Cited

U.S. PATENT DOCUMENTS

2008/0185699 A1 8/2008 Wang
2010/0027225 A1 2/2010 Yuda et al.

FOREIGN PATENT DOCUMENTS

WO WO-2008/136251 A1 11/2008

*Primary Examiner* — Hsin-Yi Hsieh
(74) *Attorney, Agent, or Firm* — McDermott Will & Emery LLP

(57) ABSTRACT

A semiconductor package and a method of manufacturing the semiconductor package are disclosed. A semiconductor package in accordance with an embodiment of the present invention includes a substrate, which has a ground circuit formed thereon, a semiconductor chip, which is mounted on the substrate, a conductive first shield, which is formed on an upper surface of the semiconductor chip and connected with the ground circuit, and a conductive second shield, which covers the substrate and the semiconductor chip and is connected with the first shield. With a semiconductor package in accordance with an embodiment of the present invention, grounding is possible between semiconductor chips because a shield is also formed on an upper surface of the semiconductor chip, and the shielding property can be improved by a double shielding structure.

3 Claims, 7 Drawing Sheets

SEMICONDUCTOR PACKAGE AND METHOD OF MANUFACTURING THE SEMICONDUCTOR PACKAGE

CROSS-REFERENCE TO RELATED APPLICATIONS

This application is a Divisional of U.S. application Ser. No. 12/892/411, filed Sept. 28, 2012, which claims the benefit of Korean Patent Application No. 10-2010-0052413, filed with the Korean Intellectual Property Office on Jun. 3, 2010, the disclosure of which is incorporated herein by reference in its entirety.

BACKGROUND

1. Technical Field

The present invention is related to a semiconductor package and a method of manufacturing the semiconductor package.

2. Description of the Related Art

It is common that electromagnetic waves are generated from a semiconductor chip mounted in a semiconductor package. The electromagnetic waves not only disturb other semiconductor chips or lower the efficiency of signal transfer but also are harmful to the human body.

Developed accordingly is a shielding technology that covers the semiconductor package with a conductive shielding member. However, although the shielding technology was able to block the electromagnetic waves emitted to the outside of the semiconductor package or the electromagnetic waves permeated into the semiconductor package from the outside, it has not been able to block the electromagnetic waves between the semiconductor chips within the semiconductor package.

Moreover, the shielding member and a ground circuit need to be connected to each other, but it has been difficult to provide a connection space between the shielding member and the ground circuit as the semiconductor package becomes smaller and thinner.

SUMMARY

The present invention provides a semiconductor package and a method of manufacturing the semiconductor package that can block electromagnetic waves between semiconductor chips mounted inside the semiconductor package.

The present invention also provides a semiconductor package and a method of manufacturing the semiconductor package that can be easily grounded for shielding.

An aspect of the present invention features a semiconductor package. The semiconductor package in accordance with an embodiment of the present invention includes: a substrate having a ground circuit formed thereon; a semiconductor chip mounted on the substrate; a first shield formed on an upper surface of the semiconductor chip and connected with the ground circuit, the first shield being conductive; and a second shield covering the substrate and the semiconductor chip and connected with the first shield, the second shield being conductive The semiconductor package can also include a molding, which seals up the semiconductor chip mounted on the substrate, and the second shield can be formed on the molding.

The semiconductor package can also include a conductive post, which connects the second shield with the first shield.

The first shield and the ground circuit can be connected by way of wire-bonding.

The first shield can be integrated in the semiconductor chip.

The semiconductor package can also include an electronic device, which has a ground electrode connected with the ground circuit, and the ground electrode can be connected with the second shield.

Another aspect of the present invention features a method of manufacturing a semiconductor package. The method of manufacturing a semiconductor package in accordance with an embodiment of the present invention includes: proving a substrate having a ground circuit formed thereon and having a semiconductor chip mounted thereon; forming a first shield on an upper surface of the semiconductor chip, the first shield being conductive; connecting the first shield with the ground circuit; and forming a second shield covering the substrate and the semiconductor chip and connected with the first shield, the second shield being conductive.

The method can also include forming a molding in such a way that the semiconductor chip mounted on the substrate is sealed up.

The method can also include forming a through-hole in the molding, the first shield being exposed through the through-hole, and the forming of a second shield can include forming a second shield connected with the first shield by coating a conductive material on the molding.

The method can also include forming a conductive post on the first shield, and the forming of a second shield can include forming a second shield connected with the conductive post.

The connecting of the first shield with the ground circuit can include connecting the first shield with the ground circuit by way of wire-bonding.

DETAILED DESCRIPTION

Hereinafter, some embodiments of the present invention will be described with reference to the accompanying drawings.

Figure 1:
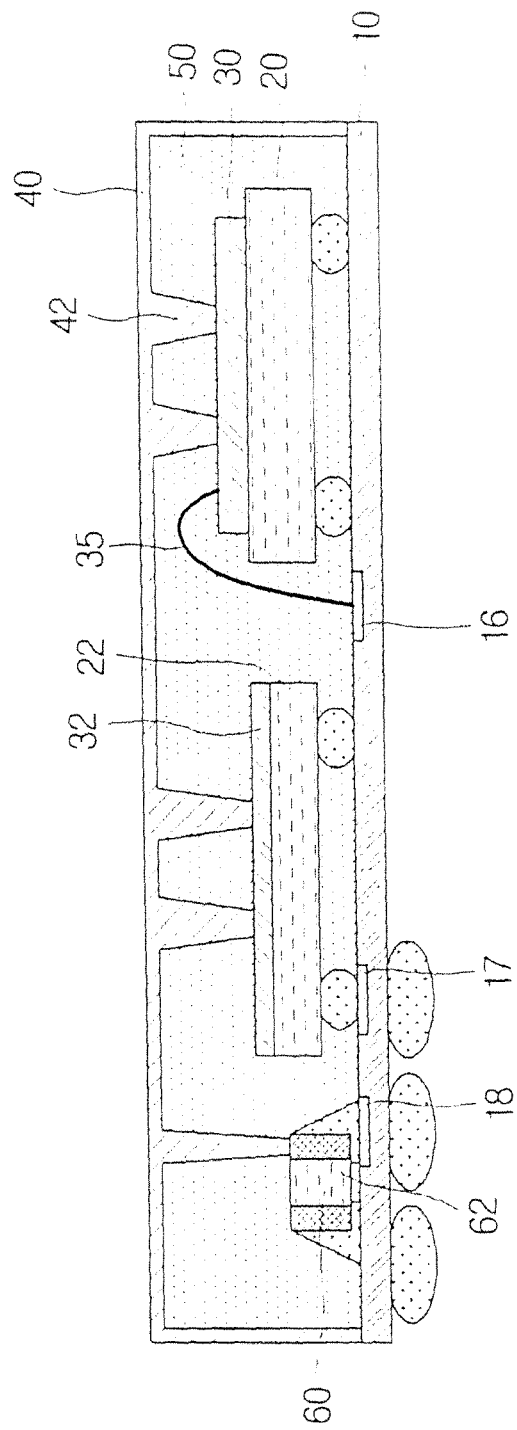
FIG. 1 is a sectional view of a semiconductor package in accordance with an embodiment of the present invention.

FIG. 1 is a sectional view of a semiconductor package in accordance with an embodiment of the present invention.

The semiconductor package in accordance with an embodiment of the present invention includes a substrate 10, a semiconductor chip 20, a first shield 30 and a second shield 40.

The substrate 10 is where the semiconductor chip 20 is mounted, and is formed with a circuit pattern, which is connected to the semiconductor chip 20, and a ground circuit, which is needed for shielding.

In the present embodiment, the semiconductor chip 20 is mounted on one surface of the substrate 10, and the ground circuit includes ground pads 16, 17, 18 required for grounding.

The semiconductor chip 20 is an electronic part in which a variety of devices are integrated to perform certain functions and is mounted on one surface of the substrate 10 in the semiconductor package of this embodiment.

The first shield 30 blocks electromagnetic waves generated from the semiconductor chip and grounds the second shield 40. For this, the first shield 30 is made of a conductive material, and is formed on an upper surface of the semiconductor chip 20 and is grounded with the ground circuit. Accordingly, since the electromagnetic waves generated from the semiconductor chip 20 is primarily blocked by the first shield 30, it is possible to block the electromagnetic waves from being transferred to an adjacent semiconductor chip. In other words, it is possible to shield between semiconductor chips within the semiconductor package.

Moreover, since the first shield 30 is connected to the second shield 40, the first shield 30 can form a double shielding structure together with the second shield 40, thereby improving the shielding property.

Moreover, since a wide ground area is formed by the first shield 30 on one face of the semiconductor chip 20, a stable ground can be provided to the semiconductor chip 20.

Specifically, the first shield 30 of the present embodiment can be a paste form that is stacked and hardened on the upper surface of the semiconductor chip 20 or a conductive film form that is adhered to the upper surface of the semiconductor chip 20.

The first shield 30 can be connected to the ground pad 16 of the ground circuit by wire 35 bonding. Here, the connection between the first shield 30 and the ground circuit is not restricted to wire-bonding and can be made by various known connection methods.

Moreover, a first shield 32 can be formed on an upper surface of a semiconductor chip 22 as an integrated part of the semiconductor chip 22. Here, the connection between the first shield 32 and the ground pad 17 can be made through an internal circuit of the semiconductor chip 22.

The second shield 40 is a part that blocks electromagnetic waves from entering and exiting between an external part and the semiconductor package. For this, the second shield 40 is made of a conductive material, such as metal, and covers the substrate 10 and the semiconductor chip 20. Moreover, the second shield 40 is connected with the first shield 30 that is connected with the ground circuit. Particularly, the second shield 40 of the present embodiment is grounded through the first shield 30 that is formed on the upper surface of the semiconductor chip 20 so that it is easier to provide the space for grounding.

Specifically, in the semiconductor package of the present embodiment, a molding 50, which seals up one surface of the substrate on which the semiconductor chip 20 is mounted, is formed, and the second shield 40 can be formed by coating a conductive material on the molding 50. In addition, the second shield 40 can be connected to the first shield 30 by being connected to a conductive post 42 that is connected to the first shield 30.

For more uniform grounding with the second shield 40, the first shield 40 can be connected with a ground electrode 62 of an electronic device 60. That is, if there is an electronic device 60, which has a ground electrode 62 connected with the ground circuit, on the substrate 10, the first shield 40 can be connected with the ground electrode 62 of the electronic device 60.

Hereinafter, a method of manufacturing a semiconductor package in accordance with another embodiment of the present invention will be described.

Figure 2:
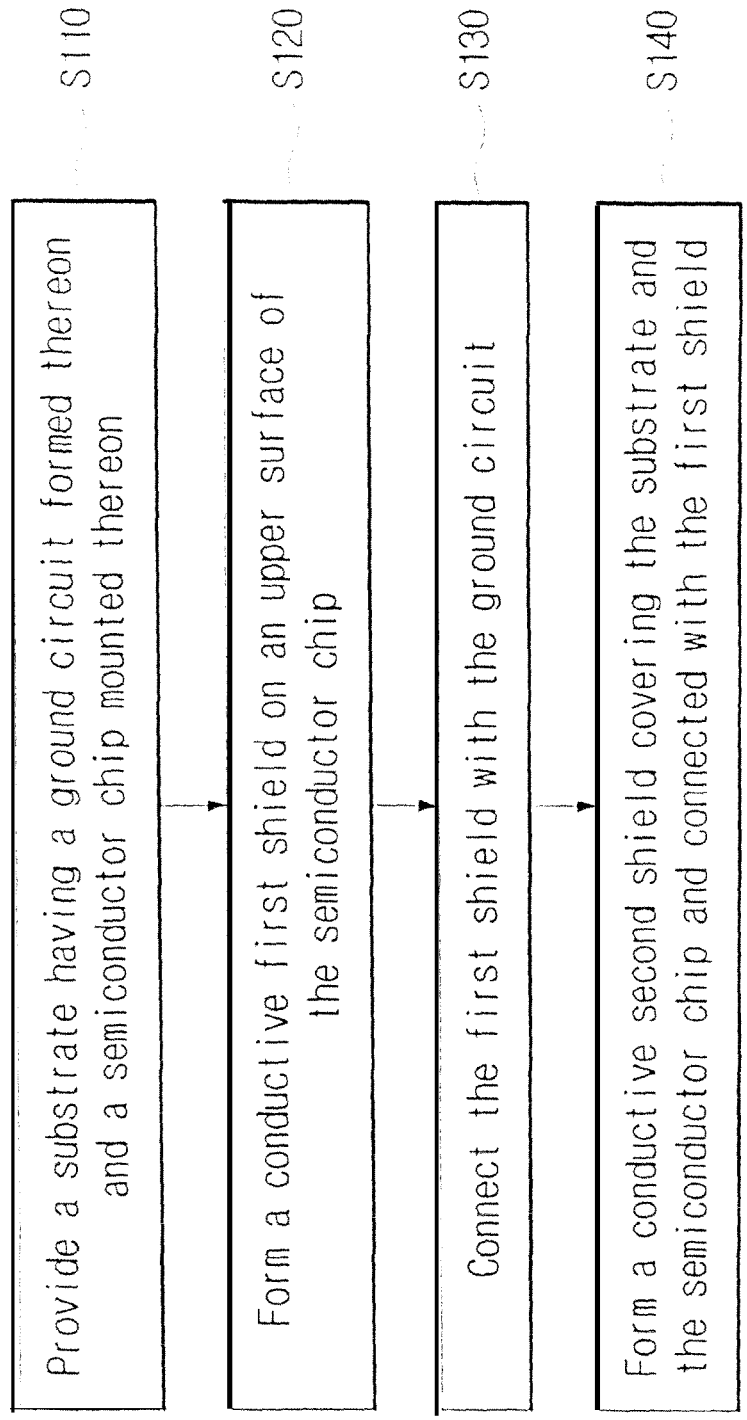
FIG. 2 is a flow diagram of a method of manufacturing a semiconductor package in accordance with another embodiment of the present invention.

FIG. 2 is a flow diagram of the method of manufacturing a semiconductor package in accordance with another embodiment of the present invention, and FIG. 3 to FIG. 7 are sectional views illustrating the method of manufacturing a semiconductor package in accordance with another embodiment of the present invention.

The method of manufacturing a semiconductor package in accordance with the present embodiment includes providing a substrate (S110), forming a first shield (S120), connecting a ground circuit (S130) and forming a second shield (S140).

In the step of providing a substrate (S110), a substrate 110, on which a ground circuit 115 is formed and a semiconductor chip 120 is mounted, is provided.

The substrate 110, which is a part on which the semiconductor chip 120 is mounted, is formed with a circuit pattern connected to the semiconductor chip 120 and the ground circuit 115 required for shielding. The semiconductor chip 120 is a part in which a variety of devices are integrated to perform certain functions, and is mounted on one face of the substrate 110 in the semiconductor package of this embodiment.

Figure 3:
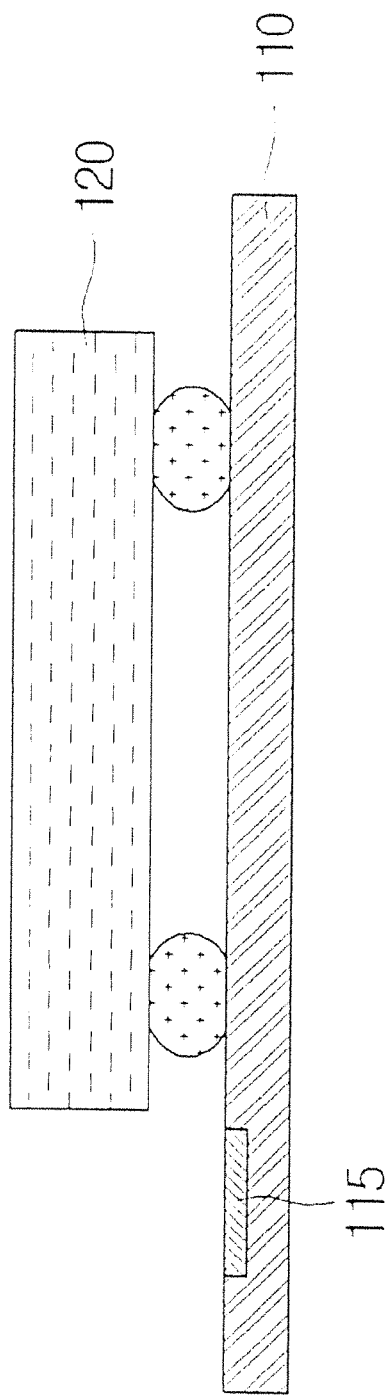
FIG. 3 to FIG. 7 are sectional views illustrating the method of manufacturing a semiconductor package in accordance with another embodiment of the present invention.

As shown in FIG. 3, in the present embodiment, the semiconductor chip 120 is mounted on one surface of the substrate 110, and the ground circuit 115 includes ground pads needed for grounding.

In the step of forming a first shied (S120), a conductive shield 130 is formed on an upper surface of the semiconductor chip 120. The first shield 130 is made of a conductive material, such as metal, and is formed on the upper surface of the semiconductor chip 120 and connected with the ground circuit 115. Accordingly, since the electromagnetic waves generated from the semiconductor chip 120 is primarily blocked by the first shield 130, it is possible to block the electromagnetic waves from being transferred to an adjacent semiconductor chip. In other words, it is possible to shield between semiconductor chips within the semiconductor package.

Figure 4:
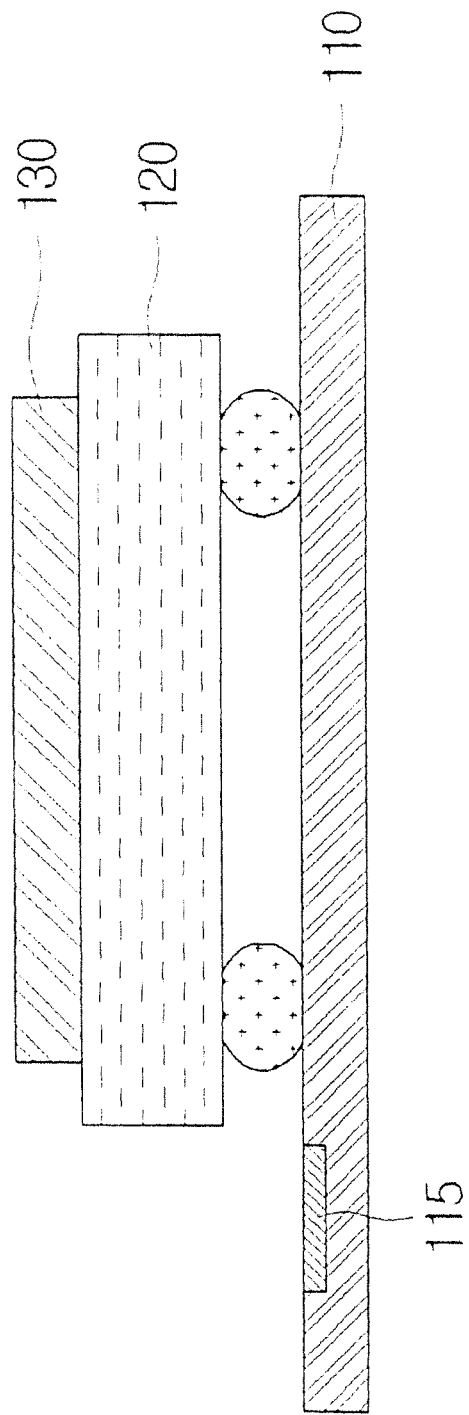

As shown in FIG. 4, the first shield 130 of the present embodiment can be stacked and hardened in a paste form on the upper surface of the semiconductor chip 120. Moreover, the first shield 130 can be adhered to the upper surface of the semiconductor chip as a conductive film form.

In the step of connecting a ground circuit (S130), the first shield 130 and the ground circuit 115 are connected to each other.

Figure 5:
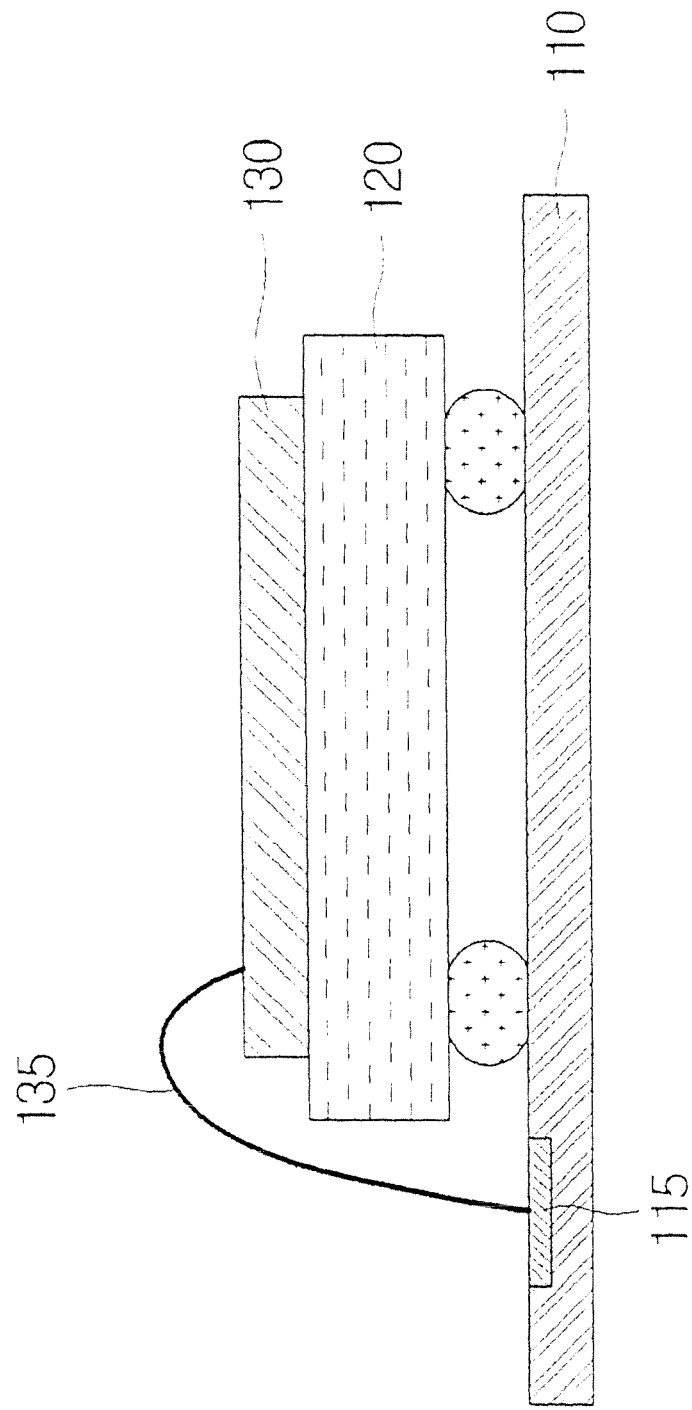

As shown in FIG. 5, in the present embodiment, the first shield 130 can be connected to a ground pad of the ground circuit 115 by wire 135 bonding. However, the connection between the first shield 130 and the ground circuit 115 is not restricted to wire-bonding and can be made by various known connection methods.

In the step of forming a second shield (S140), a conductive second shield 140, which covers the substrate 110 and the semiconductor chip 120 and is connected with the first shield 130, is formed. The second shield 140 is made of a conductive material, such as metal, and covers the substrate 110 and the semiconductor chip 120. Moreover, the second shield 140 is connected with the first shield 130, which is connected with the ground circuit 115. Particularly, the second shield 140 of the present embodiment is grounded through the first shield 130 formed on the upper surface of the semiconductor chip 120 so that it is easier to provide the space for grounding.

Figure 6:
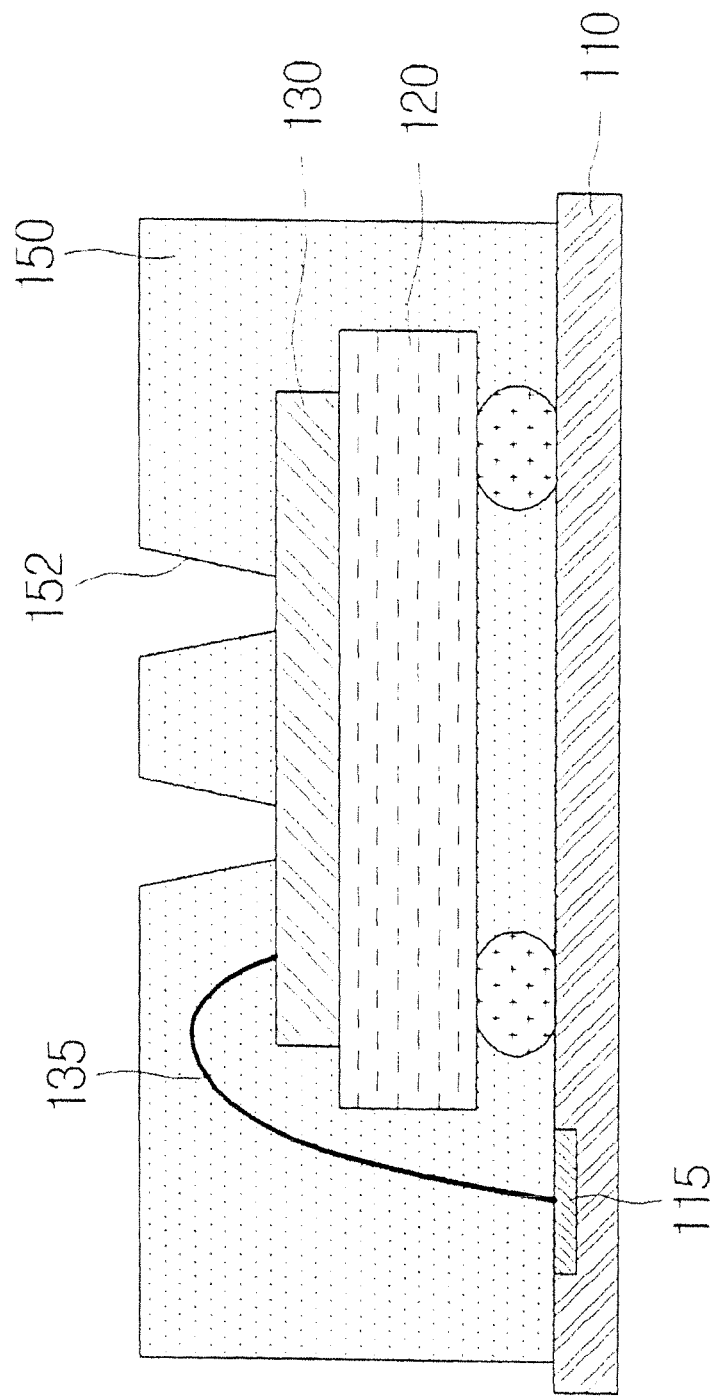
Figure 7:
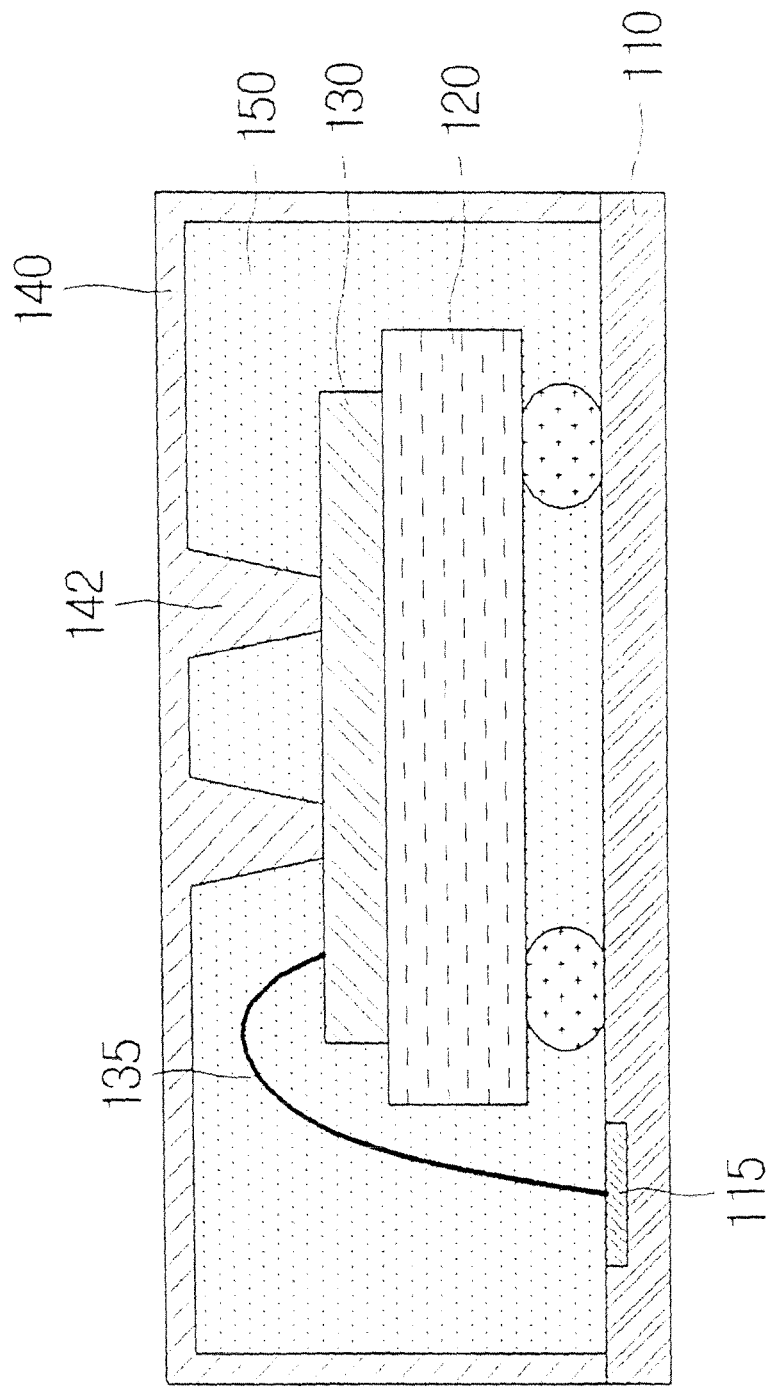

As shown in FIG. 6, a molding 150, which seals up one surface of the substrate on which the semiconductor chip 120 is mounted, can be formed in the semiconductor package of the present embodiment. Here, a through-hole 152, through which the first shield is exposed, can be formed in the molding 150 in order to ground the second shield 140. Then, as shown in FIG. 7, by coating a conductive material on the molding

150 and forming a conductive post 142 in the through-hole 152, the second shield 140 that is connected with the first shield 130 can be formed.

Moreover, it is also possible that, after a separate conductive post is formed on the first shield 130 and molded, the second shield 140 that is connected to the conductive post is formed.

Hitherto, some embodiments of the present invention have been described. However, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. A method of manufacturing a semiconductor package, the method comprising:
    providing a substrate having a ground circuit formed thereon and having a semiconductor chip mounted thereon;
    forming a first shield on an upper surface of the semiconductor chip such that the first shield is in direct contact with the upper surface of the semiconductor chip, the first shield being conductive;
    connecting the first shield with the ground circuit;
    forming a molding such that the semiconductor chip mounted on the substrate is sealed;
    forming a through-hole in the molding, the first shield being exposed through the through-hole;
    forming a second shield covering the substrate and the semiconductor chip and connected with the first shield, the second shield being conductive, wherein:
    the forming of the second shield comprises forming the second shield connected with the first shield by coating a conductive material on the molding, and
    the second shield covers a side surface and an upper surface of the molding such that the second shield is in direct contact with the substrate.

2. The method of claim 1, further comprising forming a conductive post on the first shield,
    wherein the forming of the second shield comprises forming the second shield connected with the conductive post.

3. The method of claim 1, wherein the connecting of the first shield with the ground circuit comprises connecting the first shield with the ground circuit by way of wire-bonding.

* * * * *